(12) United States Patent
Chen et al.

(10) Patent No.: US 11,174,996 B2
(45) Date of Patent: Nov. 16, 2021

(54) LIGHTING APPARATUS

(71) Applicant: XIAMEN ECO LIGHTING CO. LTD., Xiamen (CN)

(72) Inventors: Yanbiao Chen, Xiamen (CN); Hongkui Jiang, Xiamen (CN); Huiwu Chen, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

(21) Appl. No.: 16/847,318

(22) Filed: Apr. 13, 2020

(65) Prior Publication Data
US 2020/0332962 A1    Oct. 22, 2020

(30) Foreign Application Priority Data

Apr. 18, 2019 (CN) .......................... 201920528475.6

(51) Int. Cl.
| | |
|---|---|
| *F21K 9/232* | (2016.01) |
| *F21K 9/238* | (2016.01) |
| *H05B 45/20* | (2020.01) |
| *H05B 45/40* | (2020.01) |
| *F21V 19/00* | (2006.01) |
| *F21V 23/00* | (2015.01) |
| *H05K 1/02* | (2006.01) |
| *F21Y 115/10* | (2016.01) |
| *F21Y 107/70* | (2016.01) |

(52) U.S. Cl.
CPC .............. *F21K 9/232* (2016.08); *F21K 9/238* (2016.08); *F21V 19/001* (2013.01); *F21V 23/003* (2013.01); *H05B 45/20* (2020.01); *H05B 45/40* (2020.01); *H05K 1/028* (2013.01); *F21Y 2107/70* (2016.08); *F21Y 2115/10* (2016.08); *H05K 2201/10106* (2013.01)

(58) Field of Classification Search
None
See application file for complete search history.

(56) References Cited

U.S. PATENT DOCUMENTS

| | | | | |
|---|---|---|---|---|
| 2004/0196656 | A1* | 10/2004 | Tsai | F21S 6/005 362/231 |
| 2008/0137360 | A1* | 6/2008 | Van Jijswick | F21K 9/61 362/555 |
| 2009/0256496 | A1* | 10/2009 | Swarovski | F21L 4/00 315/294 |
| 2014/0265923 | A1* | 9/2014 | Toquin | F21V 29/58 315/297 |
| 2015/0043214 | A1* | 2/2015 | Suzuki | F21V 29/677 362/294 |
| 2015/0062892 | A1* | 3/2015 | Krames | F21K 9/64 362/231 |
| 2016/0273717 | A1* | 9/2016 | Krames | A61M 21/00 |

(Continued)

*Primary Examiner* — Elmito Breval
(74) *Attorney, Agent, or Firm* — Chun-Ming Shih; Lanway IPR Services (57) ABSTRACT

A lighting apparatus includes a first flexible filament with a first elongated flexible substrate. The first elongated flexible substrate is mounted with a first set of LED modules. The first set of LED modules includes LED modules of multiple colors. The second flexible filament with a second elongated flexible substrate. The second elongated flexible substrate is mounted with a second set of LED modules. The second set of LED modules include LED modules of multiple color temperatures.

20 Claims, 13 Drawing Sheets

(56) References Cited

U.S. PATENT DOCUMENTS

| | | | |
|---|---|---|---|
| 2016/0374167 A1* | 12/2016 | Aliakseyeu | H05B 45/50 |
| 2016/0377237 A1* | 12/2016 | Zhang | H01L 33/62 |
| | | | 362/311.02 |
| 2017/0012177 A1* | 1/2017 | Trottier | F21K 9/00 |
| 2017/0227169 A1* | 8/2017 | Jiang | F21K 9/235 |
| 2018/0106461 A1* | 4/2018 | Hall | H05B 47/00 |
| 2018/0135819 A1* | 5/2018 | Grandadam | F21V 23/0435 |
| 2018/0274737 A1* | 9/2018 | Abe | F21V 9/32 |
| 2018/0317290 A1* | 11/2018 | Baaijens | H05B 47/105 |
| 2018/0347766 A1* | 12/2018 | Choi | H01L 25/0753 |

* cited by examiner

LIGHTING APPARATUS

FIELD

The present invention is related to a lighting apparatus, and more particularly related to a lighting apparatus with color adjustment.

BACKGROUND

Electroluminescence, an optical and electrical phenomenon, was discover in 1907. Electroluminescence refers the process when a material emits light when a passage of an electric field or current occurs. LED stands for light-emitting diode. The very first LED was reported being created in 1927 by a Russian inventor. During decades' development, the first practical LED was found in 1961, and was issued patent by the U.S. patent office in 1962. In the second half of 1962, the first commercial LED product emitting low-intensity infrared light was introduced. The first visible-spectrum LED, which limited to red, was then developed in 1962.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

With high light output, LEDs are available across the visible, infrared wavelengths, and ultraviolet lighting fixtures. Recently, there is a high-output white light LED. And this kind of high-output white light LEDs are suitable for room and outdoor area lighting. Having led to new displays and sensors, LEDs are now be used in advertising, traffic signals, medical devices, camera flashes, lighted wallpaper, aviation lighting, horticultural grow lights, and automotive headlamps. Also, they are used in cellphones to show messages.

A Fluorescent lamp refers to a gas-discharge lamps. The invention of fluorescent lamps, which are also called fluorescent tubes, can be traced back to hundreds of years ago. Being invented by Thomas Edison in 1896, fluorescent lamps used calcium tungstate as the substance to fluoresce then. In 1939, they were firstly introduced to the market as commercial products with variety of types.

In a fluorescent lamp tube, there is a mix of mercury vapor, xenon, argon, and neon, or krypton. A fluorescent coating coats on the inner wall of the lamp. The fluorescent coating is made of blends of rare-earth phosphor and metallic salts. Normally, the electrodes of the lamp comprise coiled tungsten. The electrodes are also coated with strontium, calcium oxides and barium. An internal opaque reflector can be found in some fluorescent lamps. Normally, the shape of the light tubes is straight. Sometimes, the light tubes are made circle for special usages. Also, u-shaped tubes are seen to provide light for more compact areas.

Because there is mercury in fluorescent lamps, it is likely that the mercury contaminates the environment after the lamps are broken. Electromagnetic ballasts in fluorescent lamps are capable of producing buzzing mouse. Radio frequency interference is likely to be made by old fluorescent lamps. The operation of fluorescent lamps requires specific temperature, which is best around room temperature. If the lamps are placed in places with too low or high temperature, the efficacy of the lamps decreases.

In real lighting device design, details are critical no matter how small they appear. For example, to fix two components together conveniently usually brings large technical effect in the field of light device particularly when any such design involves a very large number of products to be sold around the world.

Flexibility as well as light effect are more and more important in today's lighting device design.

SUMMARY

In some embodiments, a lighting apparatus includes a first flexible filament, a second flexible filament, a driver, a bulb shell and a cap.

The first flexible filament has a first elongated flexible substrate. The first elongated flexible substrate is mounted with a first set of LED modules. The first set of LED modules includes LED modules of multiple colors. The second flexible filament with a second elongated flexible substrate. The second elongated flexible substrate is mounted with a second set of LED modules. The second set of LED modules include LED modules of multiple color temperatures.

The driver is used for controlling the first set of LED modules and the second set of LED modules for mixing an output light of a needed color and a needed color temperature.

The bulb shell is used for enclosing the first flexible filament and the second flexible filament and for allowing the output light pass through.

The cap is used for installing to a socket to receive an external power source.

In some embodiments, the first flexible filament has a module driver receiving a control signal from the driver to control the first set of LED modules to mix a first color.

In some embodiments, the control signal is a digital value representing the first color, the module driver translates the digital value to driving currents to the first set of LED modules.

In some embodiments, the first flexible filament and the second flexible filament are twisted together.

In some embodiments, top ends of the first flexible filament and the second flexible filament are connected to a top end of a central column.

In some embodiments, the central column is a light guide for emitting a second output light.

In some embodiments, the second output light is emitted by a red LED module for enhancing red light color rendering.

In some embodiments, an antenna is disposed on the central column.

In some embodiments, the central column has a rotation base connecting to bottom ends of the first flexible filament and the second flexible filament, the first flexible filament and the second flexible filament are twisted to each by rotating the rotation base with respect to the central column.

In some embodiments, the central column, the first flexible filament and the second flexible filament are made as a plugging module to be plugged to a plugging base on the cap.

In some embodiments, the central column is made of metal material.

In some embodiments, there is a reflective layer on an exterior surface of the central column.

In some embodiments, top ends of the first flexible filament and the second flexible filament are connected and the first flexible filament and the second flexible filament are twisted and expanded as a three-dimension light source by elastic forces of the first flexible filament and the second flexible filament.

In some embodiments, the first flexible filament has three color strips arranged in parallel and connected together forming the first flexible filament.

In some embodiments, the first flexible filament has a L shape electrode at an end of the of the first flexible filament.

In some embodiments, the first set of LED modules are disposed on a first side of the first flexible substrate of the first flexible filament and a second side of the flexible filament has a reflection layer for reflecting lights.

In some embodiments, there is a rotation switch disposed between the cap and the bulb shell for rotating the bulb shell with respect to the cap to change one of the needed color and the needed color temperature.

In some embodiments, there is a shift switch disposed between the cap and the bulb shell for changing a relative distance between the cap and the bulb shell for changing the color and the color temperature.

In some embodiments, a color rendering switch for selecting an option from a predetermined set of color rendering parameters, each color rendering parameter corresponding to a projected object type.

In some embodiments, a random color rendering parameter is generated and stored for future use.

DETAILED DESCRIPTION

Figure 1:
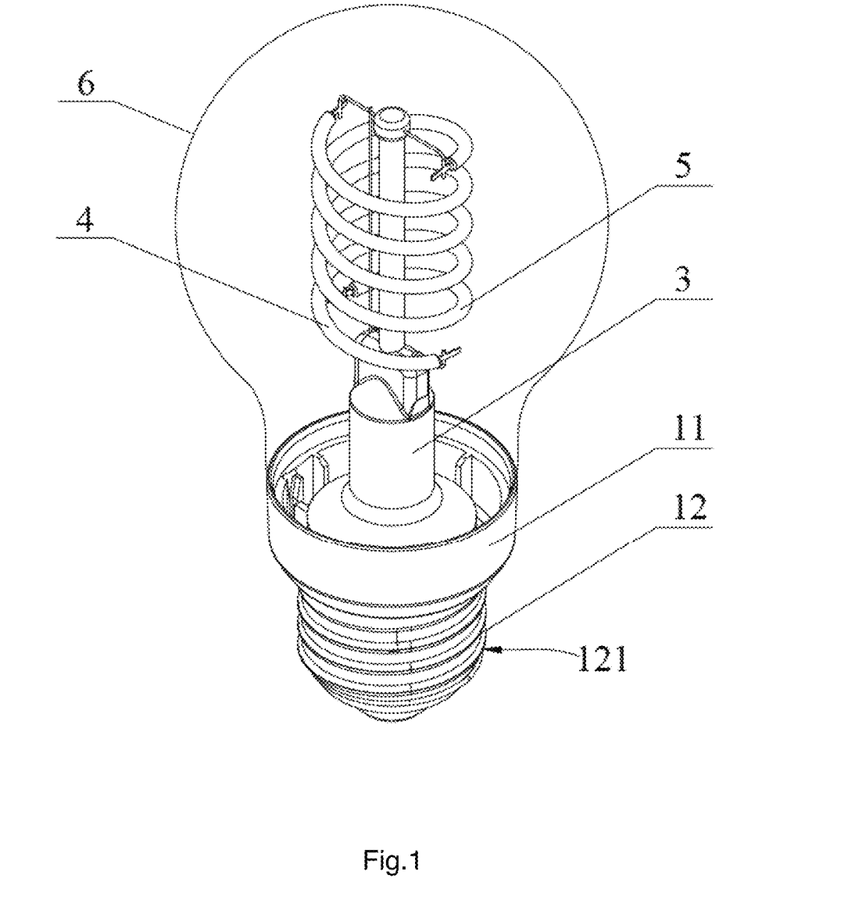
FIG. 1 illustrates a light bulb example.

In FIG. 1, a lighting apparatus includes a first flexible filament 4 with a first elongated flexible substrate. The first elongated flexible substrate is mounted with a first set of LED modules. The first set of LED modules includes LED modules of multiple colors. The lighting apparatus also includes a second flexible filament 5 with a second elongated flexible substrate. The second elongated flexible substrate is mounted with a second set of LED modules. The second set of LED modules include LED modules of multiple color temperatures.

The lighting apparatus includes a driver. The driver is used for controlling the first set of LED modules and the second set of LED modules for mixing an output light of a needed color and a needed color temperature.

The lighting apparatus has a bulb shell 6. The bulb shell 6 is used for enclosing the first flexible filament and the second flexible filament and for allowing the output light pass through.

The lighting apparatus has a cap 11 having an Edison cap 12 used for installing to a socket to receive an external power source, e.g. from the electrode 121.

Figure 2:
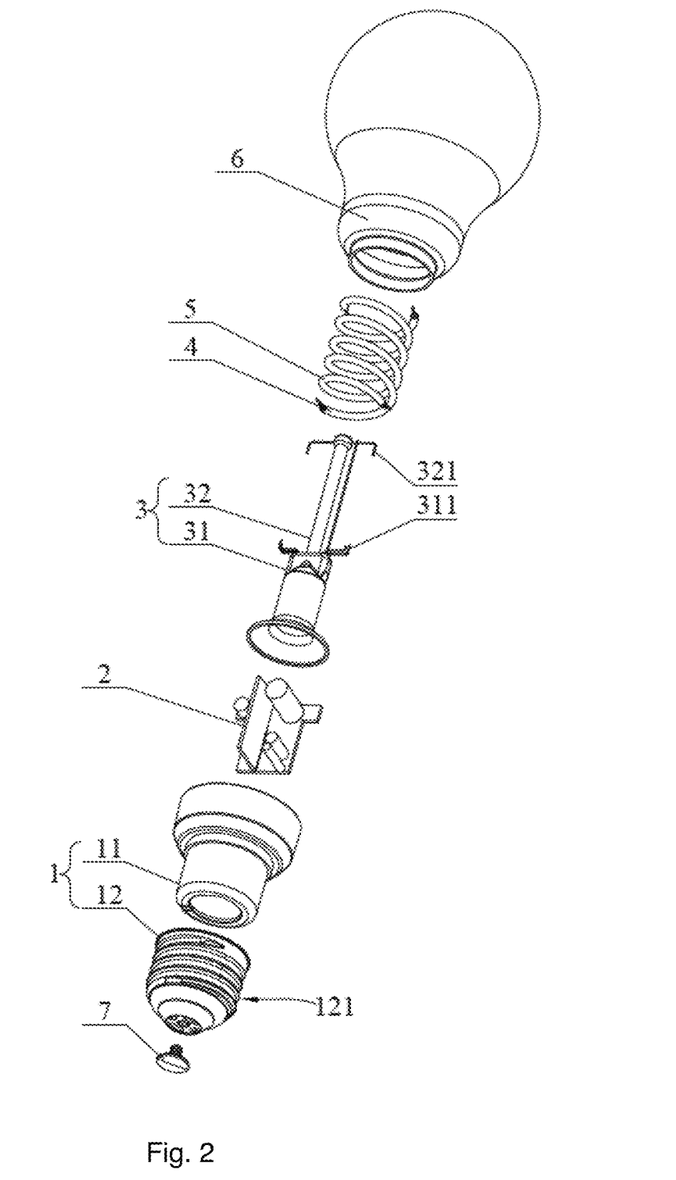
FIG. 2 illustrates components of the light bulb example.

In FIG. 2, a lighting apparatus has a bulb shell 6. The first flexible filament 4 and the second flexible filament 5. The central column 3 has a central base 31 and a central bar 32. Two hanging bars 321, 311 are used for fixing ends of the first flexible filament 4 and the second flexible filament 5. A driver 2 is placed to a heat dissipation cup 11. The cap end 7 is used as an electrode. The cap 1 includes the heat dissipation cup 11 and the Edison cup 12 providing another electrode 121.

Figure 3:
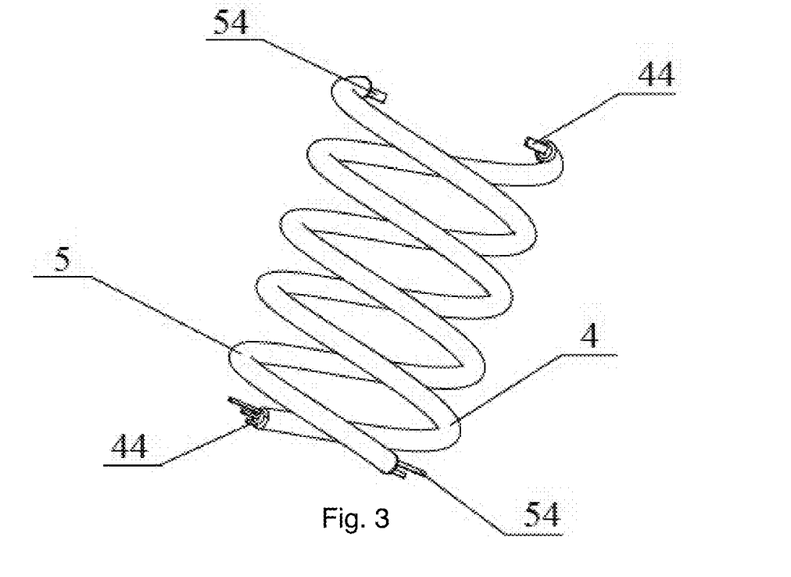
FIG. 3 is a diagram illustrating twisted filaments.
Figure 4:
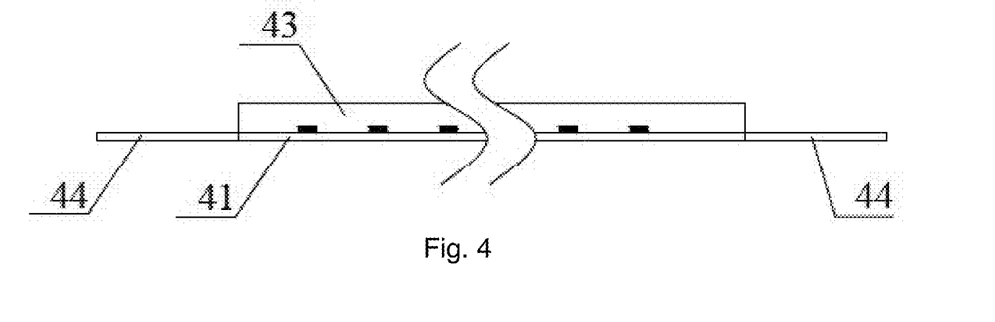
FIG. 4 is a diagram illustrating a component.

In FIG. 3, the first flexible filament 4 has multiple color strips 44 arranged in parallel. The second flexible filament 5 has two white light strips 54 arranged in parallel.

Please refer to FIG. 1 to FIG. 8. The same reference numerals refer to the same components and are not repeated for brevity.

A lighting apparatus has a cap 1, a driver 2 in the cap 1, a central column 3, a first flexible filament 4 and a second flexible filament 5. A bulb shell 6 encloses the first flexible filament 4 and the second flexible filament 5 arranged in a twisted manner.

The first flexible filament 4 includes a red LED module 42a, a green LED module 42b and a blue LED module 42c. The second flexible filament 5 includes a first white light LED module 52a and a second white light LED module 52b. The color temperature of the first white light LED module 52a is between 1500K-3000K. The color temperature of the second white light LED module 52b is between 4000K-7500K. In an example, the color temperature of the first white light LED module 52a is 2700K and the color temperature of the second white light LED module 52b is 6500K.

Figure 13:
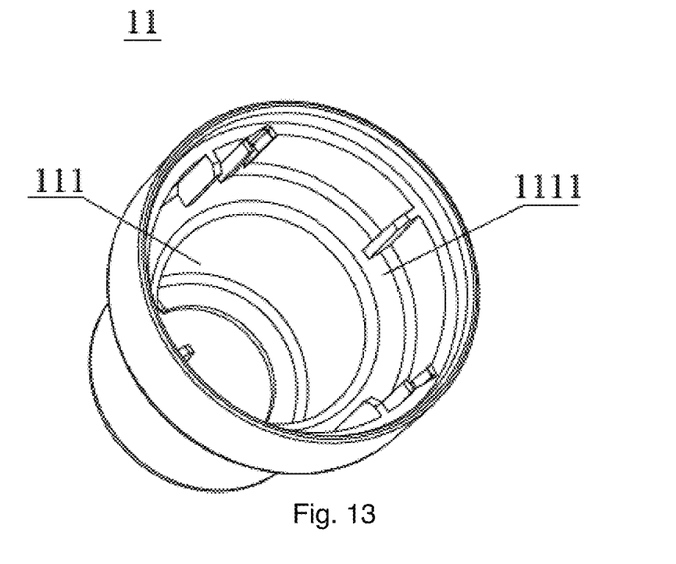
FIG. 13 shows a cap.

In FIG. 2 and FIG. 13, the cap 1 has a heat dissipation piece 11 and a cap head 12. The heat dissipation piece has an installation groove 111 used for storing the driver 2. There is a ladder 1111 in the installation groove 111.

In FIG. 3 to FIG. 6, the first flexible filament 4 also has a first substrate 41 for mounting the red LED module 42a, the green LED module 42b and the blue LED module 42c. A protection layer 43 covers the red LED module 42a, the green LED module 42b and the blue LED module 42c. The substrate 41 may be flexible circuit board made of aluminum plate. The protection layer 43 may be a transparent silicon glue layer.

Figure 5:
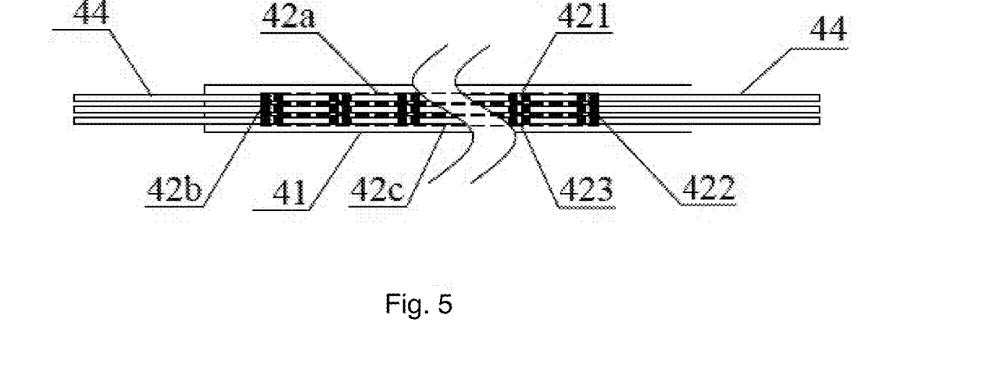
FIG. 5 is a diagram illustrating a component.
Figure 6:
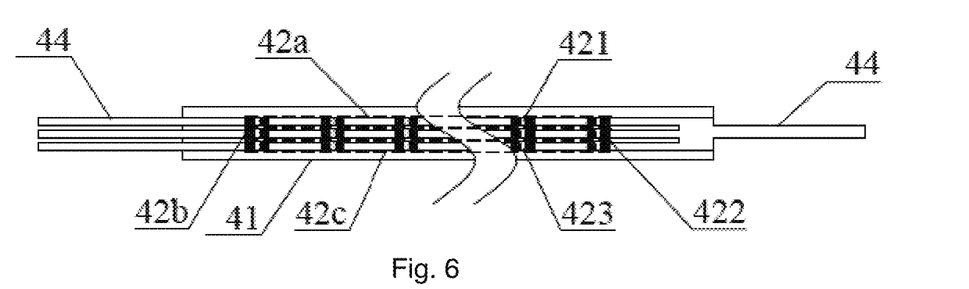
FIG. 6 is a diagram illustrating a component.

In FIG. 5 and FIG. 6, the red LED module 42a includes multiple red LED chips 421. The green LED module 42b includes multiple green LED chips 422. The blue LED module 42c includes multiple blue LED chips 423.

In FIG. 5, there are electrodes for the red LED module 42a, the green LED module 42b and the red LED module 42c.

Figure 7:
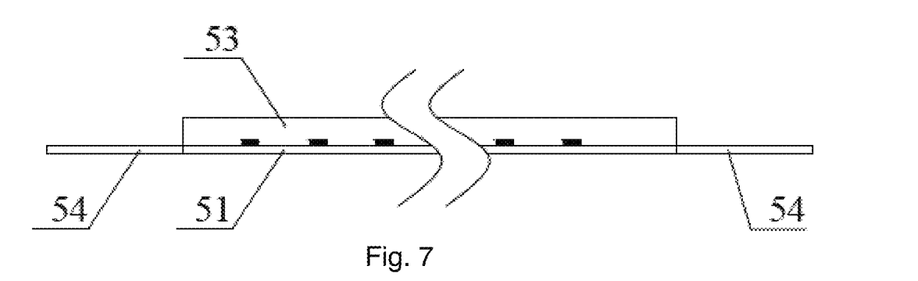
FIG. 7 is a diagram illustrating a component.
Figure 8:
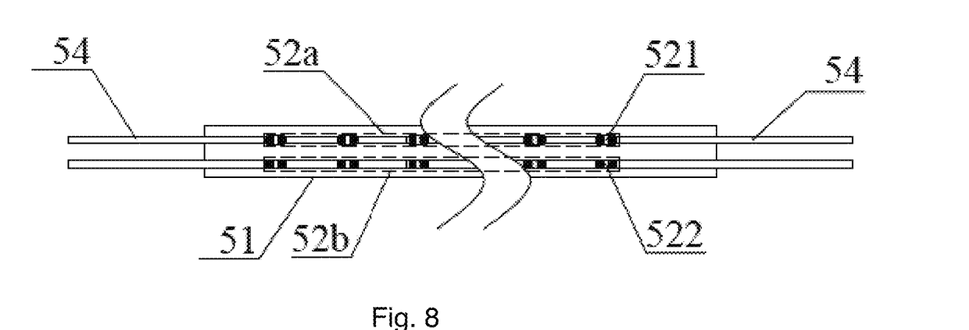
FIG. 8 is a diagram illustrating a central column.

In FIG. 3, FIG. 7 and FIG. 8, there is a second substrate 51 for mounting the first white light LED module 52a and the second white light LED module 52b. A fluorescent layer 53 cover the first white light LED module 52a and the second white light LED module 52b.

In FIG. 8, the first white light LED module 52a includes multiple first white light LED chips 521. The second white light LED module 52b includes multiple second white light LED chips 522.

In FIG. 7 and FIG. 8, the second flexible filament 5 also has electrodes 54.

Figure 9:
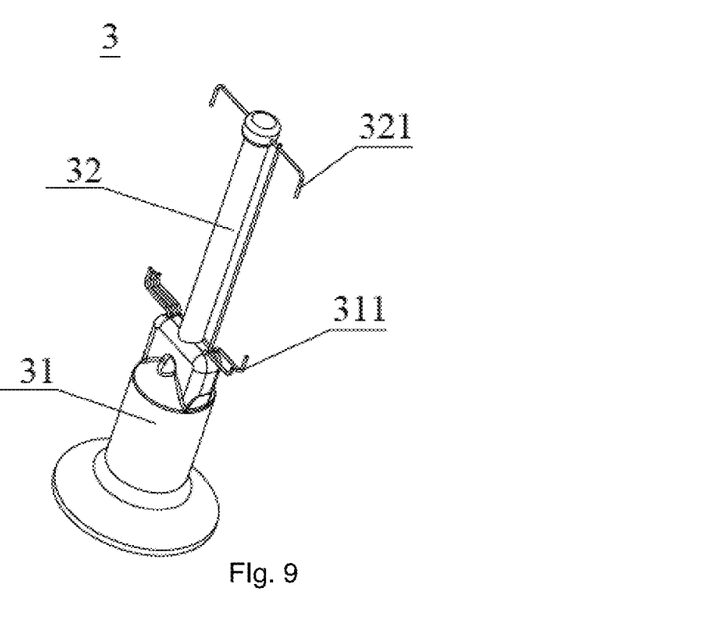
FIG. 9 is a diagram illustrating an embodiment.

In FIG. 2 and FIG. 9, the central column 3 includes a base plate 31 and a extending bar 32. There are conductive pieces 311 and 321 for conducting electricity.

Figure 10:
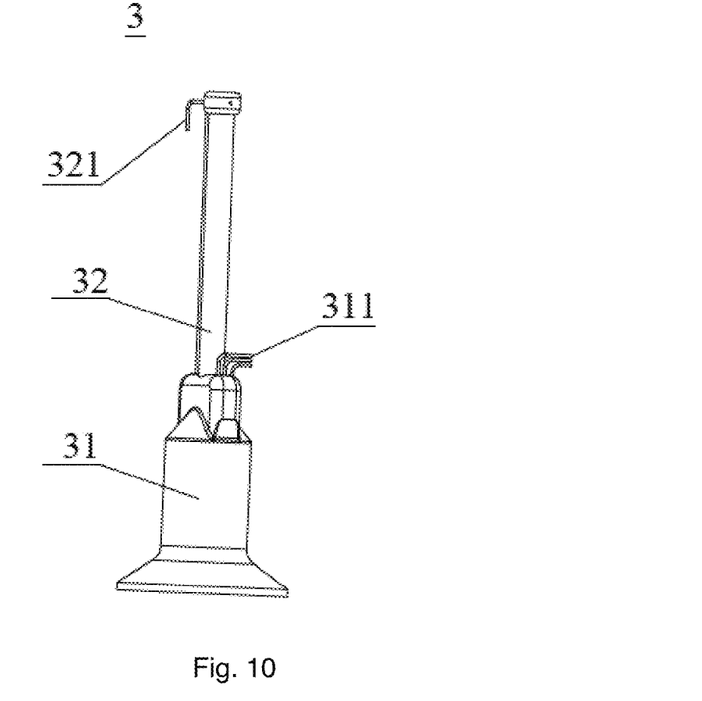
FIG. 10 is a diagram illustrating an embodiment.
Figure 11:
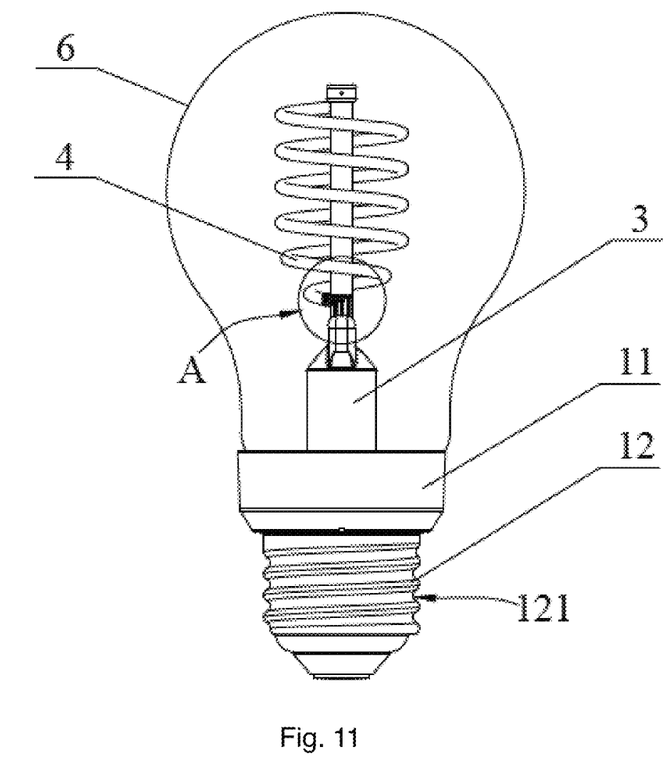
FIG. 11 illustrating an embodiment.
Figure 12:
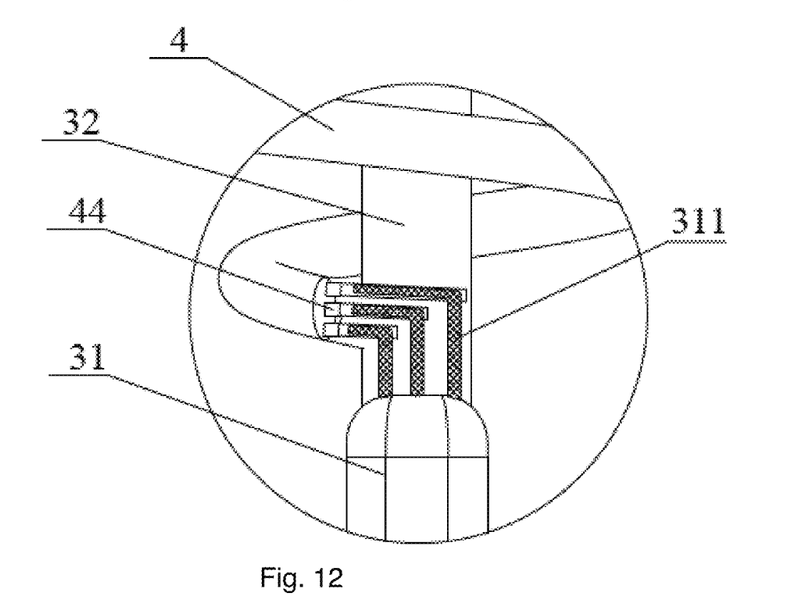
FIG. 12 shows a zoomed view of an embodiment.

In FIG. 10 and FIG. 12, the first conductive piece 311 has a L shape structure, which is easier for welding.

There is a conductive screw 7 used for connecting to neutral signal. The conductive screw groove 121 is used for connecting hot wire signal.

Figure 14:
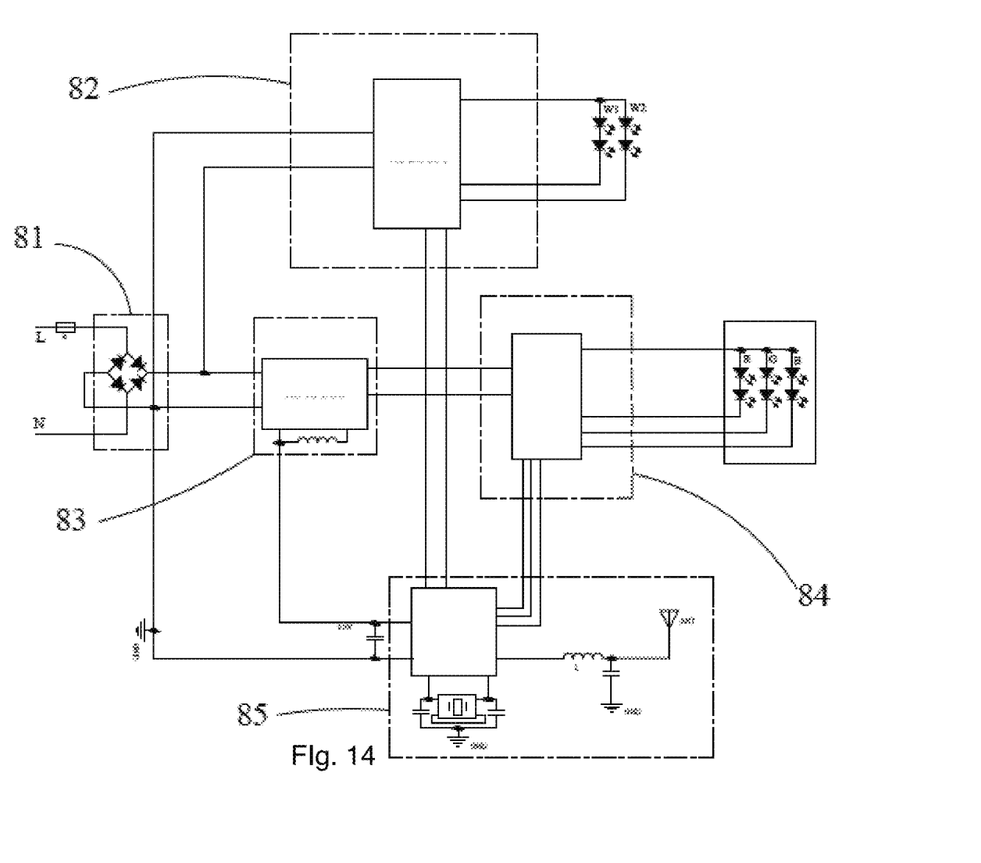
FIG. 14 shows a circuit diagram.
Figure 15:
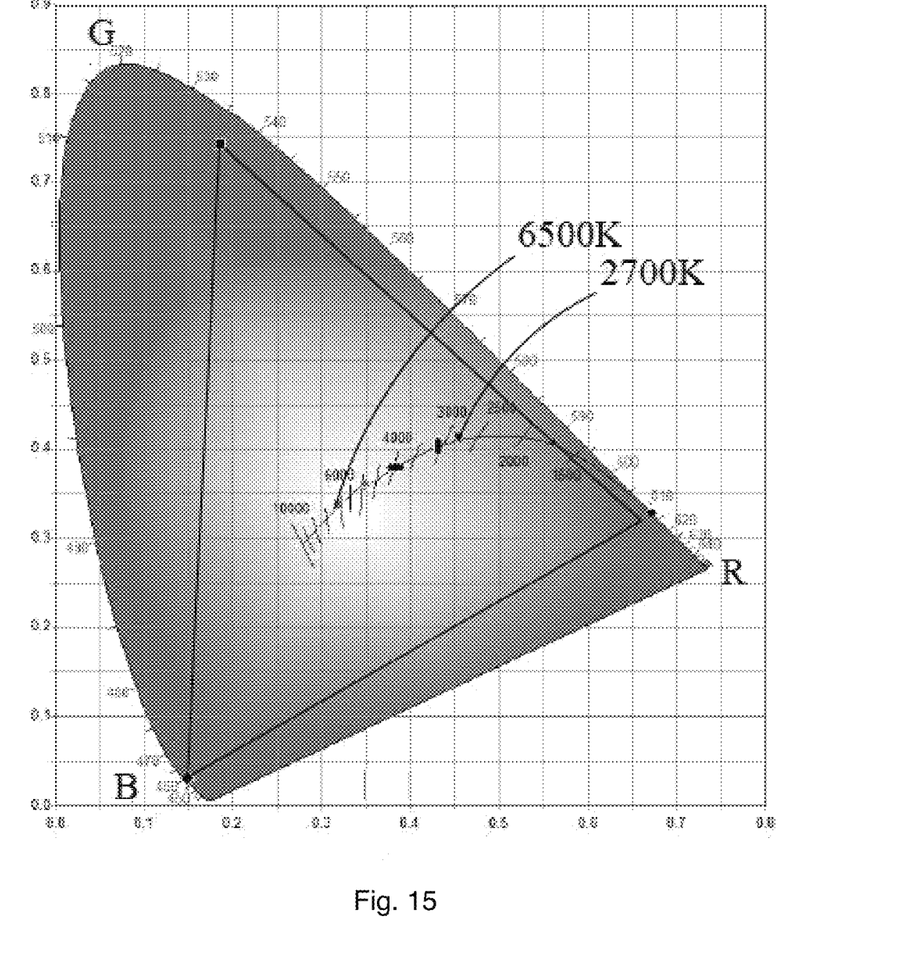
FIG. 15 shows a color map.

In FIG. 14, the letter R, G, B represent the red LED module 42, the green LED module 42b and the blue LED module 42c. W1 and W2 represent the first white light LED module 52a and the second white light LED module 52b. The 220V alternating current passes a rectifier bridge 81, the second filter unit 83 and the voltage stabilizing circuit 84 and is converted to a direct current source for powering the first flexible filament 4. By controlling the currents for the red LED module 42a, the green LED module 42b and the blue LED module 42c, the RF chip 85 controls the LED modules and generate necessary color. The first white light LED module 52a and the second white light LED module 52b are also controlled for achieving both colors and color temperature adjustment with in the color range in FIG. 15.

Figure 18:
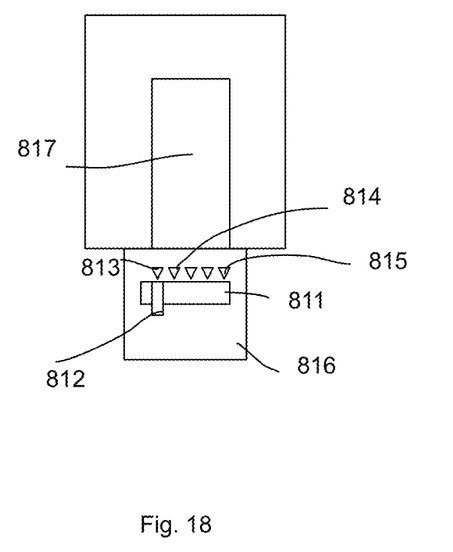
FIG. 18 shows a switch example.

Please refer to FIG. 18. In FIG. 18, a lighting apparatus has a color rendering switch 811. In this example, the color rendering switch 811 has a lever 812. Users may operate the lever 812 to associate light output by the light source 817, e.g. two flexible filaments as mentioned above, to predetermined parameters for controlling the light source 817 to generate a output light suitable for rendering color for an object type.

For example, there are several options 813, 814, 815 to be selected by aligning the lever 812 to corresponding positions. When the lever 812 is positioned to an option, e.g. option 813, the driver controls the light source 817 to mix stored settings optimized for generating a light optimized for rendering an object type, e.g. fruit, meat, glasses, diamonds, plastic goods, clothing. Such settings corresponding controlling multiple LED chips of different parameters for mixing a output light to enhance color effect when the output light is projected on an object of the corresponding object type.

This is particularly in store design, library design, or even home design. In today's design, spot lights are used for emphasizing an object, but just focusing a light beam projecting on the object does not bring the best effect. Object reflects different visual effect, i.e. rendering colors under the projected light, depending on spectrum distribution of the projected light. In some design, people may try to use high Color Rendering Index lighting devices. But, this only helps while designers want to render the colors of an object to simulate the visual effect of the object being placed under a natural sun light.

If designers want to emphasize certain color components, e.g. red color, to make the object to look even better, the spectrum of the light may be adjusted more elegantly. Such setting, however, is complicated. Therefore, the design example in FIG. 18 shows an option that specialist stores several settings, e.g. for fruit, clothing, diamonds. Users just choose an object to emphasize by using the color rendering switch without professional knowledge on colors.

In addition, there may be an option called random option 815. When users choose the option 815, each time when users turn off and turn on the lighting apparatus, a random setting from a list or completely randomly is selected for users to see how the effect is. If users like the settings, users may press a button or press the wall switch in a specific pattern, e.g. two times ON/OFF within 3 seconds, to inform the lighting apparatus to memorize the settings as a favorite one.

In addition to using a manual switch like the example in FIG. 18, the lighting apparatus may be connected to a remote device, e.g. a mobile phone with an APP with the functions for transmitting and setting color rendering settings for the lighting apparatus. Like the example mentioned above, users may choose from a predetermined set of settings, instead of handling the details by themselves.

Figure 17:
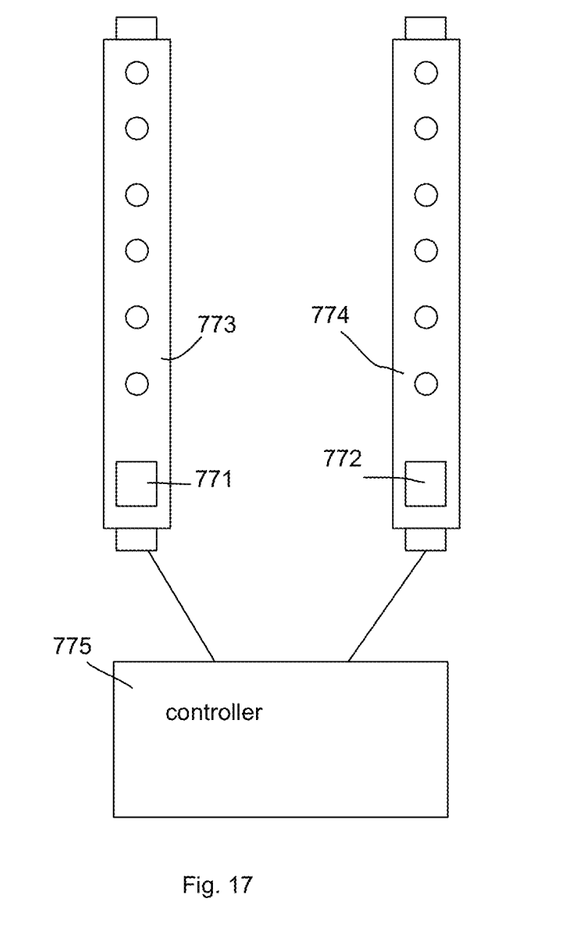
FIG. 17 shows controllers of filaments.

In FIG. 17, the first flexible filament 773 and the second flexible filament 774 respectively have a module driver 771 and a module driver 772 for receiving a control signal from the controller 775 in a driver to control the first set of LED modules to mix a first color. The control signal may be a digital value indicating a target parameter. The target parameter is translated by the module driver 771 and the module 772 as final control signals for driving the LED modules on the flexible filaments. In other words, the flexible filaments may be designed as multiple types. Each type of flexible filament may have predetermined settings and different ways for translating the control signal of the controller 775 in the driver.

For example, the control signal is a digital value representing the first color, the module driver translates the digital value to driving currents to the first set of LED modules.

In some embodiments, the first flexible filament and the second flexible filament are twisted together.

Figure 16:
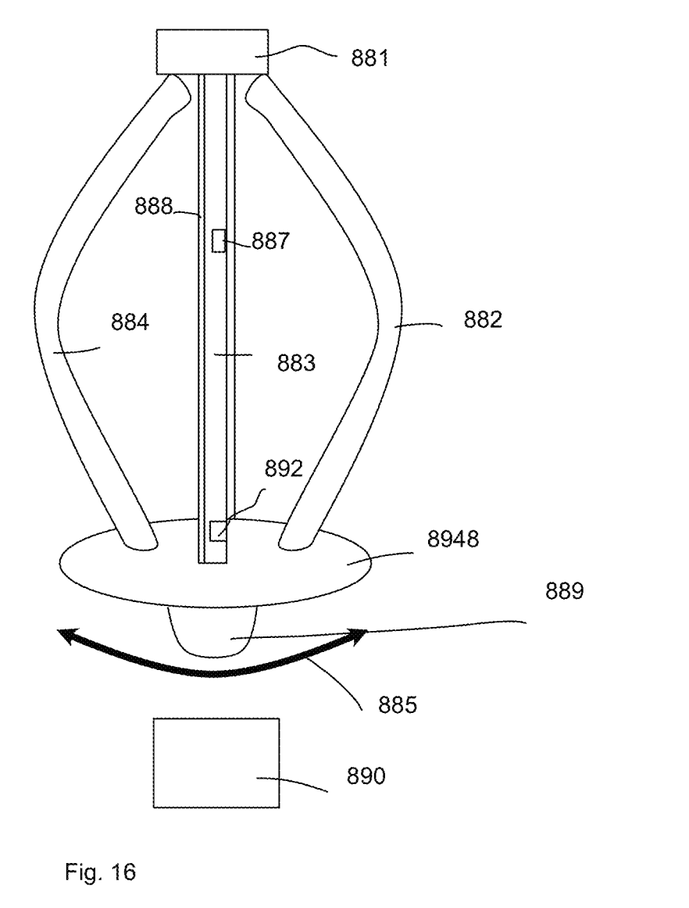
FIG. 16 shows another embodiment.

In FIG. 16, top ends of the first flexible filament 884 and the second flexible filament 882 are connected to a top end of a central column 883.

In some embodiments, the central column is a light guide for emitting a second output light.

In FIG. 16, the second output light is emitted by a red LED module 892 for enhancing red light color rendering.

In FIG. 16, an antenna 887 is disposed on the central column.

In FIG. 16, the central column has a rotation base 894 connecting to bottom ends of the first flexible filament 884 and the second flexible filament 882, the first flexible filament 882 and the second flexible filament 884 are twisted to each by rotating the rotation base with respect to the central column 883. For example, during manufacture, the flexible filaments are arranged as mentioned above. The flexible filaments are rotated by using the rotation base 894 as FIG. 16 to twist the flexible filament. Then, a fixing structure, like a stop structure or glue, is applied to the rotation base to fix the rotation angle. Such design makes it easy to assemble a twisted flexible filament module.

In FIG. 16, the central column, the first flexible filament and the second flexible filament are made as a plugging module with a plugging structure 889 to be plugged to a plugging base 890 on the cap.

In some embodiments, the central column is made of metal material. Such design helps heat dissipation by using the metal central column.

In FIG. 16, there is a reflective layer 888 on an exterior surface of the central column 883.

In some embodiments, top ends of the first flexible filament and the second flexible filament are connected and the first flexible filament and the second flexible filament are twisted and expanded as a three-dimension light source by elastic forces of the first flexible filament and the second flexible filament.

In some embodiments, the first flexible filament has three color strips arranged in parallel and connected together forming the first flexible filament.

In some embodiments, the first flexible filament has a L shape electrode at an end of the of the first flexible filament.

Figure 20:
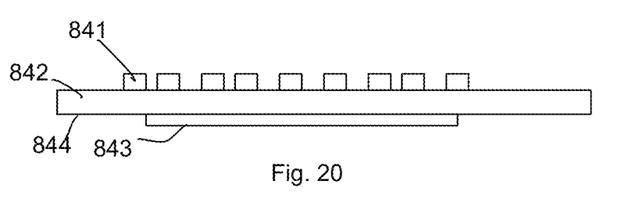
FIG. 20 shows a filament structure.

In FIG. 20, the first set of LED modules 841 are disposed on a first side 842 of the first flexible substrate of the first flexible filament and a second side 844 of the flexible filament has a reflection layer 843 for reflecting lights.

Figure 19A:
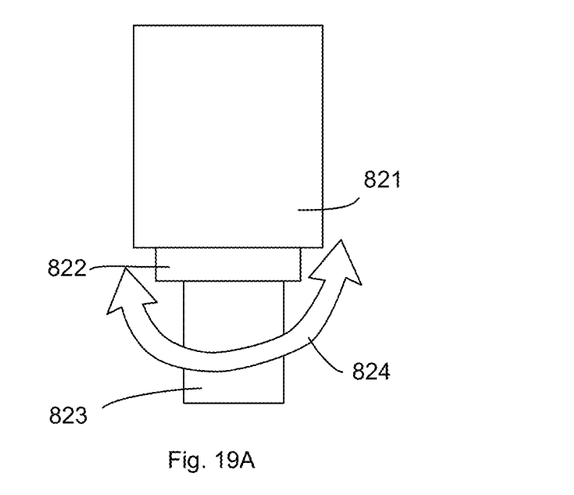
FIG. 19A and FIG. 19B show two adjustment structures.

In FIG. 19A, there is a rotation switch 822 disposed between the cap 823 and the bulb shell 821 for rotating the bulb shell 821 with respect to the cap 823 to change one of the needed colors and the needed color temperature with a rotation 824.

Figure 19B:
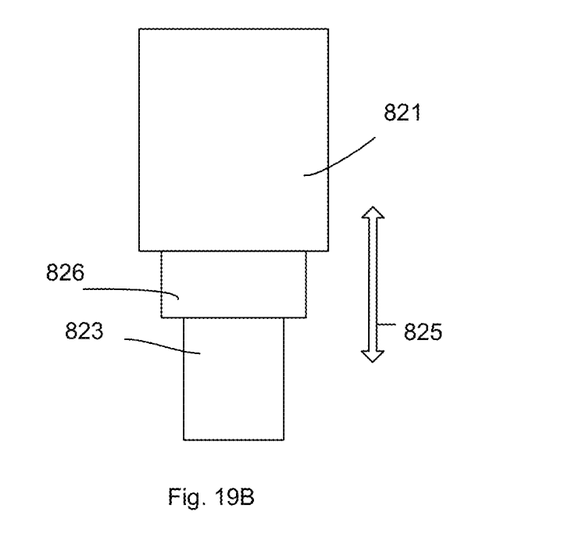

In FIG. 19B, there is a shift switch 826 disposed between the cap 823 and the bulb shell 821 for changing a relative distance 825 between the cap 823 and the bulb shell 821 for changing the color and the color temperature.

In some embodiments, a color rendering switch for selecting an option from a predetermined set of color rendering parameters, each color rendering parameter corresponding to a projected object type.

In some embodiments, a random color rendering parameter is generated and stored for future use.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A lighting apparatus, comprising:
 a first flexible filament with a first elongated flexible substrate mounted with a first set of LED modules, the first set of LED modules comprising LED modules of multiple colors;
 a second flexible filament with a second elongated flexible substrate mounted with a second set of LED modules, the second set of LED modules comprising LED modules of multiple color temperatures; and
 a driver for controlling the first set of LED modules and the second set of LED modules for mixing an output light of a needed color and a needed color temperature;
 a bulb shell for enclosing the first flexible filament and the second flexible filament and for allowing the output light pass through; and
 a cap for installing to a socket to receive an external power source.

2. The lighting apparatus of claim 1, wherein the first flexible filament has a module driver receiving a control signal from the driver to control the first set of LED modules to mix a first color.

3. The lighting apparatus of claim 2, wherein the control signal is a digital value representing the first color, the module driver translates the digital value to driving currents to the first set of LED modules.

4. The lighting apparatus of claim 1, wherein the first flexible filament and the second flexible filament are twisted together.

5. The lighting apparatus of claim 4, wherein top ends of the first flexible filament and the second flexible filament are connected to a top end of a central column.

6. The lighting apparatus of claim 5, wherein the central column is a light guide for emitting a second output light.

7. The lighting apparatus of claim 6, wherein the second output light is emitted by a red LED module for enhancing red light color rendering.

8. The lighting apparatus of claim 4, wherein an antenna is disposed on the central column.

9. The lighting apparatus of claim 4, wherein the central column has a rotation base connecting to bottom ends of the first flexible filament and the second flexible filament, the first flexible filament and the second flexible filament are twisted to each by rotating the rotation base with respect to the central column.

10. The lighting apparatus of claim 9, wherein the central column, the first flexible filament and the second flexible filament are made as a plugging module to be plugged to a plugging base on the cap.

11. The lighting apparatus of claim 4, wherein the central column is made of metal material.

12. The lighting apparatus of claim 11, wherein there is a reflective layer on an exterior surface of the central column.

13. The lighting apparatus of claim 1, wherein top ends of the first flexible filament and the second flexible filament are connected and the first flexible filament and the second flexible filament are twisted and expanded as a three-dimension light source by elastic forces of the first flexible filament and the second flexible filament.

14. The lighting apparatus of claim 1, wherein the first flexible filament has three color strips arranged in parallel and connected together forming the first flexible filament.

15. The lighting apparatus of claim 1, wherein the first flexible filament has a L shape electrode at an end of the of the first flexible filament.

16. The lighting apparatus of claim 1, wherein the first set of LED modules are disposed on a first side of the first flexible substrate of the first flexible filament and a second side of the flexible filament has a reflection layer for reflecting lights.

17. The lighting apparatus of claim 1, wherein there is a rotation switch disposed between the cap and the bulb shell for rotating the bulb shell with respect to the cap to change one of the needed color and the needed color temperature.

18. The lighting apparatus of claim 1, wherein there is a shift switch disposed between the cap and the bulb shell for changing a relative distance between the cap and the bulb shell for changing the color and the color temperature.

19. The lighting apparatus of claim 1, wherein a color rendering switch for selecting an option from a predetermined set of color rendering parameters, each color rendering parameter corresponding to a projected object type.

20. The lighting apparatus of claim 19, wherein a random color rendering parameter is generated and stored for future use.

\* \* \* \* \*